United States Patent [19]

Revillet et al.

[11] Patent Number: 5,291,082
[45] Date of Patent: Mar. 1, 1994

[54] LOW LOSS POWER SWITCH

[75] Inventors: Georges Revillet, Barcelonne; Philippe Berge, Colomiers, both of France

[73] Assignee: Crouzet Automatismes, Valence, France

[21] Appl. No.: 935,098

[22] Filed: Aug. 26, 1992

[30] Foreign Application Priority Data

Aug. 27, 1991 [FR] France .................. 91 10896

[51] Int. Cl.$^5$ .................................... H03K 17/60
[52] U.S. Cl. .................................. 307/570; 307/254; 307/546
[58] Field of Search ............... 307/570, 572, 254, 542, 307/546, 360, 362

[56] References Cited

U.S. PATENT DOCUMENTS

| | | | |
|---|---|---|---|
| 4,356,408 | 10/1982 | Glennon | 307/254 |
| 5,063,307 | 11/1991 | Zommer | 307/362 |
| 5,166,541 | 11/1992 | Mori | 307/572 |

FOREIGN PATENT DOCUMENTS

4005168A1  8/1991  Fed. Rep. of Germany .
62-94020   4/1987  Japan .

OTHER PUBLICATIONS

"A Switching Circuit Composed of BJT and MOS-FET", by Yasuo Ohashi et al., The Transactions of the IECE of Japan, vol. E69, No. 4, Apr. 1986, pp. 509-511.

Primary Examiner—Stuart S. Levy
Assistant Examiner—Toan Tran
Attorney, Agent, or Firm—Lowe, Price, LeBlanc & Becker

[57] ABSTRACT

A power switch comprising: at least one bipolar transistor (T1), the base of which is controlled through an amplifier 12 by a control signal (VC) and a sensor (10) of the current (I) flowing through the switch; at least one insulated gate bipolar transistor (IGBT) (T2) connected in parallel to said at least one bipolar transistor (T1), the gate of which is controlled by said control signal (VC); and means (S) for inhibiting the base control of said at least one bipolar transistor (T1) when the current flowing through the switch is lower than a predetermined value ($I_0$).

6 Claims, 2 Drawing Sheets

LOW LOSS POWER SWITCH

BACKGROUND OF THE INVENTION

The present invention relates to the field of power switches and more particularly of low loss power switches.

Often used power switches comprise bipolar transistors, MOS transistors and Insulated Gate Bipolar Transistors (IGBT).

It is generally admitted that it is the bipolar transistor operating in saturation condition that has the least power loss in the on-state. Indeed, a MOS transistor has, in the on state, a resistive characteristic between drain and source. Therefore, the power loss between drain and source is proportional to the square of the drain current and the loss becomes important for high currents. As for the saturated bipolar transistor, i.e. a transistor, the base current of which is greater than the collector current divided by the gain of the transistor, has a voltage drop (Vce) between collector and emitter which is practically constant and of a low value (in the order of 0.3 to 0.5 volt). Similarly, IGBTs have a Vce voltage drop which is practically constant but higher than that of a bipolar transistor (in the order of 1 volt).

However, the bipolar transistors which are capable of switching very high currents generally have a low gain and need a high base current to become saturated. Thus, the advantage of the low consumption between collector and emitter is counter-balanced by the drawback of substantial power loss in the base control circuit. In opposition, the control of IGBTs and MOS transistors is achieved upon a capacitive gate and the power needed for their control is negligible.

If a bipolar transistor is provided for switching a predetermined maximum current, its base control circuit will be designed for providing a current saturating the transistor when this maximum current flows through the latter. As previously mentioned, this base current is relatively important and it is generally still provided to the transistor when the current to switch becomes low. Thus, the power needed for controlling the transistor when it switches a lower current than intended is uselessly great and the efficiency of the transistor switch drops.

SUMMARY OF THE INVENTION

An object of the invention is to achieve a power switch having an as low as possible power loss in the on-state over a great range of switched currents.

The invention more particularly aims at a power switch liable to operate for switching currents within a first extended range of values and moreover liable to occasionally operate out of this range.

This object is achieved thanks to a power switch comprising: at least one bipolar transistor, the base of which is controlled through an amplifier by a control signal and a sensor of the current flowing through the switch; at least one Insulated Gate Bipolar Transistor (IGBT) connected in parallel to said at least one bipolar transistor, the gate of which is controlled by said control signal; and means for inhibiting the base control of said at least one bipolar transistor when the current flowing through the switch is lower than a predetermined value.

According to an embodiment of the invention, said means are controlled by a comparator comparing the current flowing through the switch to said predetermined value.

According to another embodiment of the invention, said amplifier is operable to provide a base current to the bipolar transistor, which is adapted to saturate the bipolar transistor for switched currents reaching a maximum current. Said predetermined value is selected equal to the current for which the dissipated power in the bipolar transistor is equal to the dissipated power in the IGBT.

According to another embodiment of the invention, the switch comprises a second comparator comparing the current flowing through the switch to a second predetermined value, associated to means shutting down the control of said transistors if the current is greater than the second predetermined value.

According to another equipment of the invention, the switch comprises a third comparator comparing the current flowing through the switch to a third predetermined value, associated to means shutting down the control of said transistors when the current remains greater than the third predetermined value during a time greater than a predetermined time.

According to another embodiment of the invention, means are provided for storing the amount of consecutive shut downs of the control of said transistors and for definitively shutting down their control if this amount is greater than a predetermined amount.

BRIEF DESCRIPTION OF THE DRAWINGS

The foregoing and other objects, features and advantages of the invention will be exposed in more detail in the following description of preferred embodiments by referring to the accompanying drawings among which.

DESCRIPTION OF PREFERRED EMBODIMENTS

The invention is based on the analysis of the losses of various types of power switches in various operating conditions.

Figure 1:
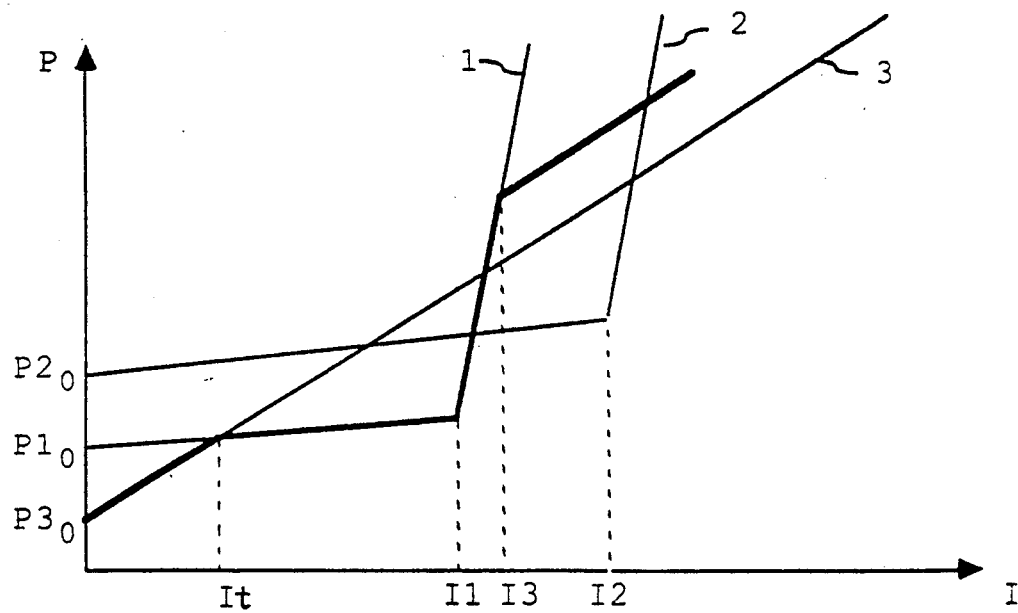
FIG. 1 shows diagrams of power loss as a function of the currents to be switched for different types of power switches.

FIG. 1 shows waveforms of the power loss in a bipolar transistor and in an IGBT as a function of the switched current I. This lost power P is the sum of the power dissipated between the main terminals of the transistor and the power needed to control the transistor.

Waveform 1 corresponds to a bipolar transistor designed to be saturated below a maximum switched current I1. For currents I varying between 0 and I1, power P increases regularly from an initial value P1$_0$. This value P1$_0$ corresponds substantially to the power consumed by the base control circuit designed for saturating the bipolar transistor when current I1 flows through the latter. If current I increases beyond I1, power P increases very rapidly. This is due to the fact that the bipolar transistor starts operating in linear conditions wherein its collector/emitter voltage Vce starts to increase.

Waveform 2 shows the power loss in a bipolar transistor, the base control circuit of which is designed to saturate the transistor when switching a maximum current I2 greater than I1. The power dissipated in the control circuit has a value $P2_0$. This wave form is obtained from the previous one by shifting the latter upwards of the quantity $P2_0-P1_0$ and to the right of the quantity I2-I1.

Waveform 3 corresponding to an IGBT, does not depend on the maximum current to be switched, provided that a high enough voltage is applied to its gate. Power P increases regularly from a low power $P3_0$ which is simply the power needed for supplying the control circuit.

By analysing the waveforms of FIG. 1, the applicant noted that, no matter what value the maximum current to switch has, the bipolar transistor has the lowest loss for switched currents comprised between a transition current It and this maximum current. On the contrary, the IGBT is more advantageous for currents I lower than It. The applicant deduced therefrom that it would be interesting, for a chosen maximum switched current I1, to design a power switch having the characteristics of an IGBT for switching currents lower than It, and of a bipolar transistor for switching currents higher than It.

Figure 2:
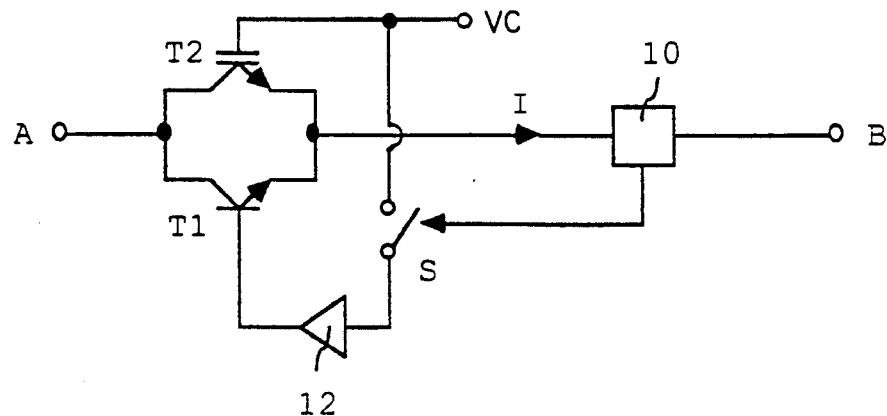
FIG. 2 shows an embodiment of a power switch according to the invention.

FIG. 2 shows an embodiment of a power switch according to the invention having the above characteristics. The switch comprises a bipolar transistor T1 and an IGBT T2 connected in parallel. The collectors of transistors T2 and T1 are connected to a terminal A intended to be connected to a high potential (or to the terminal of a load, the other terminal of which is connected to a high potential). The emitters of transistors T1 and T2 are connected to a terminal B through a current control device 10. Terminal B is intended to be connected to a low potential (or to a terminal of a load, the other terminal of which is connected to a low potential). The gate of transistor T2 is connected to a terminal C on which a control voltage is applied for controlling the switch. Terminal C is also connected to the base of transistor T1 through a switch S and a current amplifier 12. Amplifier 12, when the control voltage is present at its input, provides a base current to transistor T1 saturating the latter for switched currents reaching a chosen maximum value I1. Switch S is controlled by the control device 10 which determines if current I flowing between terminals A and B is greater than a predetermined current $I_0$ adjusted to a value near the value It mentioned by referring to FIG. 1.

The operation of this switch is as follows: as soon as a control voltage is applied to terminal C, IGBT T2 turns on. If current I establishes at a value lower than $I_0$, device 10 leaves switch S open and transistor T2 is the only one on. If current I establishes at a value greater than $I_0$, device 10 closes switch S and bipolar transistor T1 turns on. Then, current I flows preferentially through transistor T1 as its Vce voltage drop is lower than that of IGBT T2.

As it appears from the above, the switch according to the invention has the characteristics of an IGBT for currents lower than $I_0$, and the characteristics of a bipolar transistor for currents higher than $I_0$. Therefore, this switch has the lowest possible power loss in a switching current range comprised between a low value and a maximum current for which the bipolar transistor is still saturated.

Furthermore, as previously mentioned, when current I increases above the maximum value $I_1$, transistor T1 starts operating linearly and, as shown in FIG. 1, the power loss in this transistor increases rapidly. But, as the gate control of IGBT T2 is maintained, the power dissipated by transistor T1 increases until the moment, corresponding to a current $I_3$ in FIG. 1, when the Vcc voltage of transistor T1 attains the Vce voltage of transistor T2. As shown, the equality of voltages Vce for current $I_3$ is achieved when the power dissipated by transistor T1 is greater of the quantity $P1_0-P3_0$ than the power which would be dissipated in transistor T2 alone. Above current $I_3$, the switch according to the invention, has a characteristic curve parallel to that of transistor T2 alone, shifted upwards of the value $P1_0-P3_0$. Then, current I flows preferentially through transistor T2 and the losses are reduced. The characteristic curve of the switch according to the invention is shown in bold line between a zero current and a current greater than $I_3$.

Thus, for achieving a switch liable to operate normally between a low value and a maximum value ($I_1$) and to occasionally operate shortly above this maximum value ($I_1$), a switch according to the invention will be selected so that the base control circuit of the bipolar transistor is designed for this maximum value. The power loss of the base control circuit (12) of transistor T1 is thus limited to an acceptable value ($P1_0$ instead of, for example $P2_0$) in order to obtain the characteristic of waveform 2. Indeed, as it has been described, it is not necessary with the switch according to the invention to design the base control circuit for saturating transistor T1 for occasional current surges greater than the maximum current $I_1$, because these current surges preferentially flow through IGBT T2 causing less power losses than in the case where these current surges would flow through non saturated transistor T1.

Figure 3:
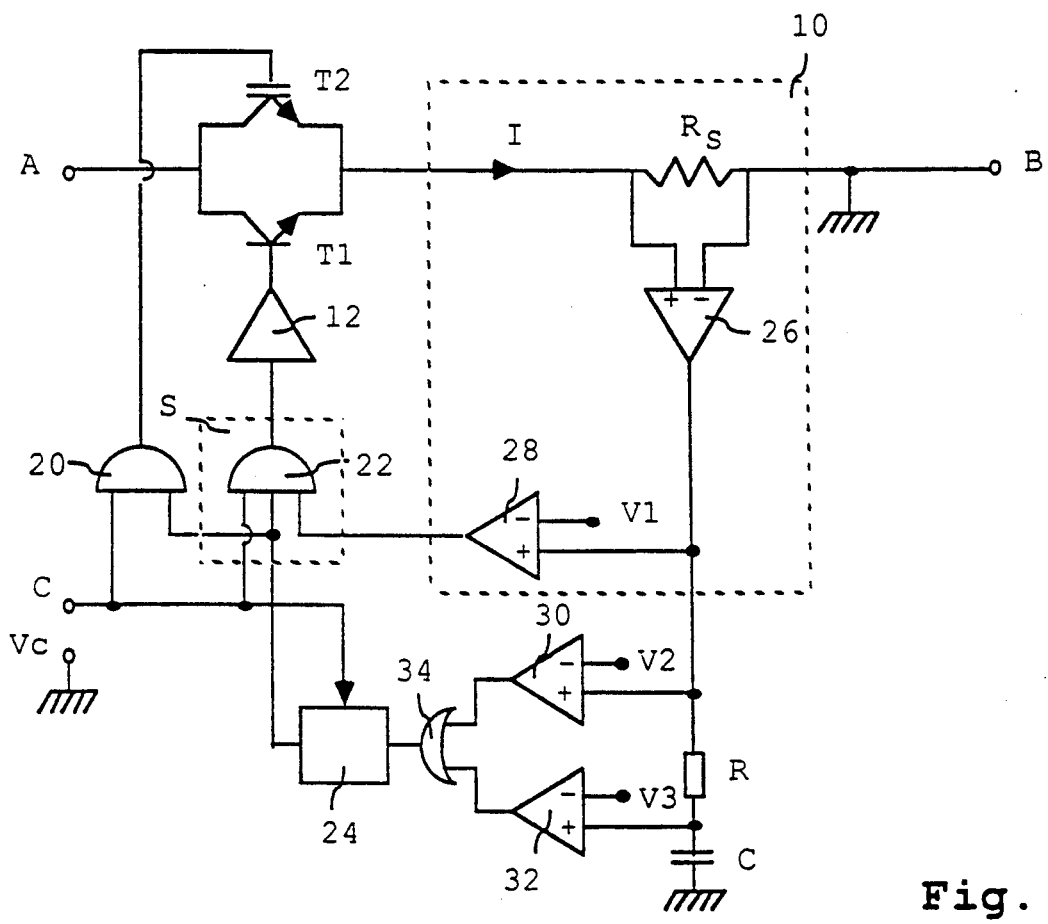
FIG. 3 shows the power switch of FIG. 2 associated to protection circuits.

FIG. 3 shows the power switch of FIG. 2 associated to protection elements. An embodiment of the current control device 10 and of switch S is also shown in more detail. The gate of transistor T2 is connected to the output of an AND gate 20 having two inputs. The input of amplifier 12 which controls the base of transistor T1, is connected to the output of an AND gate 22 having three inputs. The first inputs of AND gates 20 and 22 are connected to terminal C to which is applied a logical control signal VC which is referenced to terminal B, for example connected to ground. The second inputs of AND gates 20 and 22 are normally maintained high by a memory device 24. Thus, when a control signal VC is applied at a high state to terminal C, this signal is transmitted to the gate of transistor T2 which is turned on. Transistor T1 is only turned on if the third input of AND gate 22 is set high.

In series between the transistors and terminal B, a shunt resistor Rs is provided which converts the current I into a voltage amplified by a differential amplifier 26. The output voltage of amplifier 26 is compared to a reference voltage V1 by a comparator 28, the output of which controls the third input of AND gate 22. When the output voltage of amplifier 26 is greater than voltage V1, the output of comparator 28 becomes high and gate 22 becomes transparent. Voltage V1 is chosen equal to the output voltage of amplifier 26 when resistor Rs is traversed by the previously mentioned current $I_0$, which is, in a preferred embodiment, chosen equal to value It.

The elements not yet described of FIG. 3 form a protection circuit of the transistors or of the load controlled by these transistors. The output voltage of amplifier 26 is compared to a second reference voltage V2, greater than value V1, by a comparator 30. The output voltage of amplifier 26 is also applied to a low-pass filter comprised of an RC cell, the output of which is compared to a third reference voltage V3, comprised between values V1 and V2, by a comparator 32. The output of comparators 30 and 32 are connected to an OR gate 34 controlling the input of memory device 24. As previously mentioned, the output of device 24 is normally high and a plus at its input causes its output to go low. Thus, when current I exceeds a limit value corresponding to voltage V2, the output of comparator 30 goes high, this high state being transmitted to the input of memory device 24 through OR gate 34. The output of device 24 goes low and shuts down the control of transistors T1 and T2. The high state of the output of device 24 is reestablished by a falling edge of control signal VC.

If current I reaches a value comprised between the values corresponding to voltages V3 and V2, the transistors will be simultaneously turned off if current I is maintained sufficiently long. Indeed, the output voltage of the RC cell increases progressively and reaches value V3 after a time interval depending on the values of resistor R and of capacitor C.

Moreover, the memory device 24 will be chosen such that, after turning off transistors T1 and T2 twice, for example, the high state of the output of device 24 is not any more reestablished by a falling edge of control signal VC.

Those skilled in the art will easily achieve the memory device 24 with flip-flops and logic gates according to the specific needs.

Figure 4:
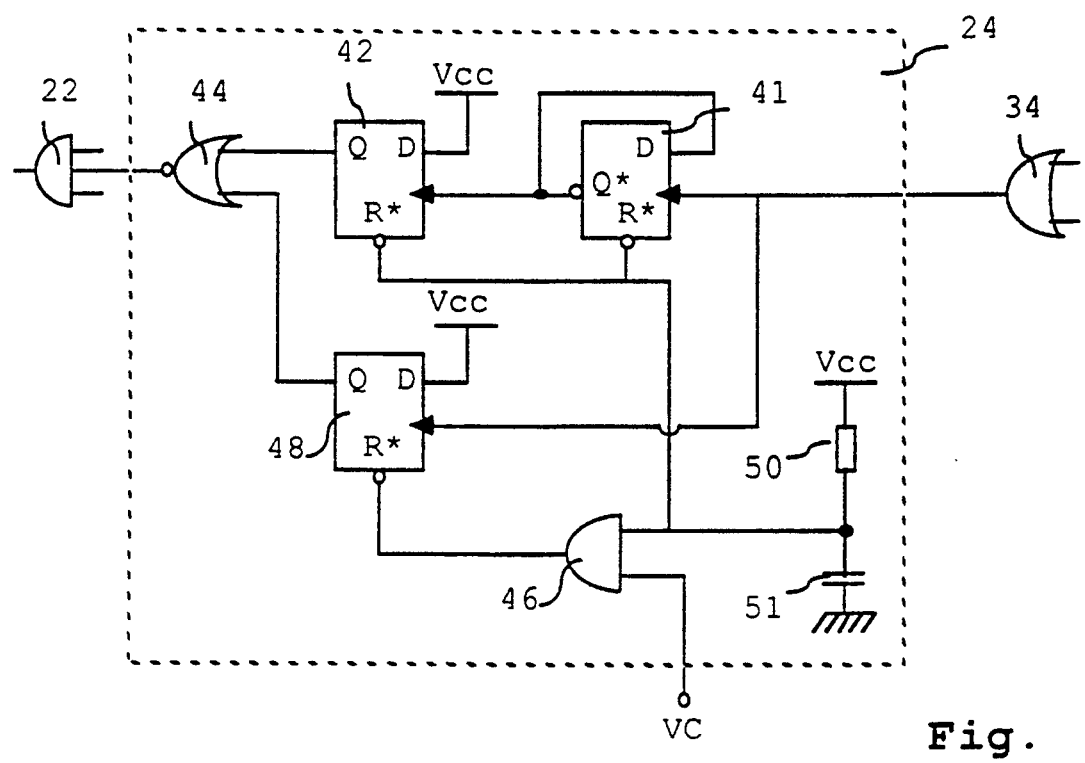
FIG. 4 shows an embodiment of a memory device used in the protection circuit of FIG. 3.

FIG. 4 shows, as an example, a possible schematic diagram of such a memory device 24. The device comprises a first D type flip-flop 41, the inverted output Q* of which is connected to the date input D, and the clock input of which is connected to the output of OR gate 34 providing the state to store. The output Q* is also connected to the clock input of a second D type flip-flop 42, the D input of which is connected to a high supply voltage Vcc. The non inverted output Q of flip-flop 42 is connected to the input of a NAND gate 44 controlling AND gate 22. The control signal VC is provided to the input of an AND gate 46, the output of which is connected to an inverted reset input R* of a third D type flip-flop 48. The output Q of this flip-flop 48 is connected to the other input of NAND gate 44, its D input is connected to voltage Vcc and its clock input is connected to the output of OR gate 34. The reset inputs R* of the other flip-flops and the other input of AND gate 46 are connected to the junction between a resistor 50 connected to voltage Vcc and a capacitor 51 connected to ground. This resistor/capacitor circuit ensures a reset of the flip-flops at power on.

Many alternatives and modifications of the invention will appear to those skilled in the art. For example, at the place of each transistor, a plurality of transistors can be provided in parallel.

We claim:

1. A power switch comprising:
   at least one bipolar transistor (T1), the collector and emitter of which define two ends of a power switch, the base of which is controlled through an amplifier (12) and an inhibiting means (S) by a control signal (VC); and a sensor (10) connected to one end of the switch for sensing current (I) flowing through the switch; and
   at least one insulated gate bipolar transistor (IGBT) (T2) connected in parallel to said at least one bipolar transistor (T1), the gate of which is controlled by said control signal (VC);
   wherein said inhibiting means (S) is controlled by said sensor for inhibiting the base control of said at least one bipolar transistor (T1) when the current flowing through the switch is lower than a predetermined value (I0) of the sensor.

2. A power switch as claimed in claim 1, wherein said sensor comprises a comparator, said means (S) is controlled by said comparator (28) comparing the current flowing through the switch to said predetermined value (I0).

3. A power switch as claimed in claim 1, wherein said amplifier (12) is operable to provide a base current to the bipolar transistor (T1), which is adapted to saturate the bipolar transistor for switched currents reaching a maximum current (I1), and wherein said predetermined value ($I_0$) is selected equal to the current (It) for which the dissipated power in the bipolar transistor is equal to the dissipated power in the IGBT.

4. A switch as claimed in claim 2, the sensor further comprising a second comparator (30) comparing the current flowing through the switch to a second predetermined value, for controlling said inhibiting means to shut down the base control of said at least one bipolar transistor if the current through the switch is greater than the second predetermined value.

5. A power switch as claimed in claim 4, the sensor further comprising a third comparator (32) comparing the current flowing through the switch to a third predetermined value, for controlling said inhibiting means to shut down the base control of said at least one bipolar transistor when the current through the switch remains greater than a predetermined time.

6. A switch as claimed in claim 4, wherein said sensor further comprises means (24) for storing the amount of consecutive shut downs of the control of said at least one bipolar transistor and for definitively shutting down the base control if this amount is greater than a predetermined amount.

* * * * *